United States Patent

Fujino et al.

[11] Patent Number: 5,307,420
[45] Date of Patent: Apr. 26, 1994

[54] METHOD AND APPARATUS FOR MONITORING PLATES IN MARKING DEVICE

[75] Inventors: Noboru Fujino; Tohru Takamura; Nobuyuki Aoyagi, all of Tokyo, Japan

[73] Assignee: Kabushiki Kaisha Shinkawa, Tokyo, Japan

[21] Appl. No.: 852,486

[22] Filed: Mar. 16, 1992

Related U.S. Application Data

[63] Continuation of Ser. No. 556,037, Jul. 20, 1990, abandoned.

[30] Foreign Application Priority Data

Jul. 22, 1989 [JP] Japan ................. 1-189226

[51] Int. Cl.$^5$ ............................................. G06K 9/00
[52] U.S. Cl. ................................ 382/8; 382/1; 348/95; 348/92
[58] Field of Search .................. 358/101, 107, 106; 382/8, 1; 356/394, 376

[56] References Cited

U.S. PATENT DOCUMENTS

| | | | |
|---|---|---|---|
| 3,679,316 | 7/1972 | Boujon | 356/394 |
| 3,958,509 | 5/1976 | Murray et al. | 358/101 |
| 4,072,928 | 2/1978 | Wilde | 382/8 |
| 4,149,187 | 4/1979 | Palmer et al. | 358/106 |
| 4,520,389 | 5/1985 | Hornschuh | 358/101 |
| 4,573,190 | 2/1986 | Tsunoda et al. | 382/1 |
| 4,733,360 | 3/1988 | Kobayashi et al. | 382/8 |
| 4,851,902 | 7/1989 | Tezuka et al. | 382/8 |
| 4,853,968 | 8/1989 | Berkin | 382/8 |
| 4,862,510 | 8/1989 | Duncan et al. | 382/8 |
| 4,866,629 | 9/1989 | Chen et al. | 382/8 |
| 4,872,024 | 10/1989 | Nagai et al. | 382/8 |
| 4,924,505 | 5/1990 | Leberl et al. | 382/8 |
| 4,926,489 | 5/1990 | Danielson et al. | 382/8 |
| 4,942,619 | 7/1990 | Takagi et al. | 382/8 |
| 4,962,423 | 10/1990 | Yamada et al. | 382/8 |

Primary Examiner—Leo H. Boudreau
Assistant Examiner—Christopher Kelley
Attorney, Agent, or Firm—Koda and Androlia

[57] ABSTRACT

A method for monitoring conditions of printing plates in a marking device which uses relief-plate printing. The method employs a camera installed beneath a movable printing plate so that the condition of the printing plate is checked via the camera. A device utilizing such a method includes a plate holder to which the printing plate is attached, an X-Y-Z driver which moves the plate holder in X, Y and Z directions, a camera installed with its photographing side facing up and positioned away from a workpiece carrying table which positions and carries a workpiece that is to be printed, an image processor which processes image signals from the camera, and a monitor which displays images in accordance with the output of the image processor. Thus, the printing plate is photographed by the camera and its condition is checked.

2 Claims, 1 Drawing Sheet

METHOD AND APPARATUS FOR MONITORING PLATES IN MARKING DEVICE

This is a continuation of application Ser. No. 556,037, filed Jul. 20, 1990 now abandoned.

FIELD OF THE INVENTION

The present invention relates to a method and apparatus for monitoring the condition of the printing plate in marking device which uses relief-plate printing.

PRIOR ART

In marking devices used to mark, for example, semiconductor devices, long term use results in deformation and sagging of the printing plate. Also, faulty marking may occur as a result of the adhesion of dirt or ink.

When such problems occur, the plate holder to which the printing plate is attached is removed from the plate holder attachment, and the printing plate is inspected with the naked eye.

In the conventional technique described above, the plate holder must be removed from the plate holder attachment each time the condition of the printing plate is checked or each time deformation or sagging of the plate is checked, and adhesion of dirt or ink to the plate etc. is checked. Accordingly, the working efficiency is poor.

SUMMARY OF THE INVENTION

The object of the present invention is to provide a printing plate monitoring method and apparatus therefor by which the condition of the printing plate is checked without removing the plate holder from the plate holder attachment, so that the working efficiency is improved.

The printing plate monitoring method for achieving the object of the present invention is characterized in that a camera is installed with its photographing side facing up at a position away from a workpiece table which positions and carries a workpiece that is to be printed, a printing plate attached to a plate holder is moved to a point above the camera, so that the condition of the printing plate is checked by camera.

The printing plate monitoring apparatus for achieving the object of the present invention is characterized in that the apparatus includes: a plate holder to which a printing plate is attached, an X-Y-Z driving means which moves the plate holder in the X, Y, Z directions, a camera installed with its photographing side facing up at a position away from a workpiece carrying table which positions and carries the workpiece that is to be printed, an image processor which processes the image signals sent from the camera, and a monitor which displays images in accordance with the output of the image processor, thus photographing the printing plate by the camera.

The printing plate is moved to a point above the camera and the condition of the printing plate is checked periodically or when the work lot is changed or when the printing condition is found to be poor.

If deleterious conditions of dirt or ink adhesion to the printing plate are found, it is merely necessary to clean the printing plate without dismounting the printing plate from the plate holder attachment. If the printing plate is deformed or sagging, then it is necessary to remove the plate holder from the plate holder attachment and replace the printing plate with a new one.

Thus, since the condition of the printing plate can be quickly checked without removing the plate holder from the plate holder attachment section, the working efficiency can be improved.

DETAILED DESCRIPTION OF THE INVENTION

Below, one embodiment of the present invention will be described with reference to the accompanying drawings.

Figure 1:
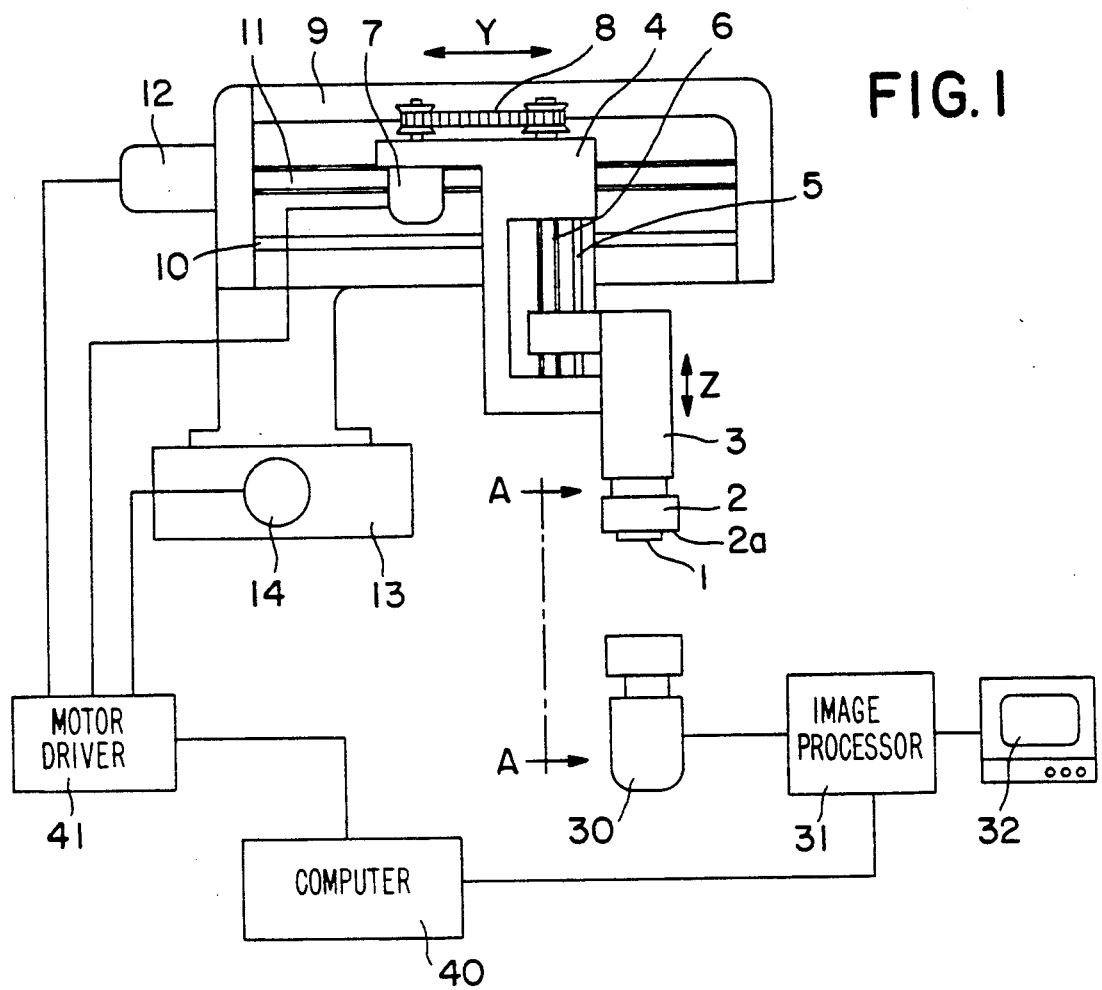
FIG. 1 is a schematic front view of the marking device of one embodiment of the present invention.

As is shown in FIG. 1, a plate holder 2 with a printing plate (rubber stamp) 1 attached thereto is mounted to a plate holder attachment 3 so that the plate holder 2 can be freely mounted and dismounted. The plate holder attachment 3 is provided so that the plate holder attachment 3 is free to slide on a guide rod 5 which is installed in an upright position on a first horizontal moving table 4. The plate holder attachment 3 is also engaged with a Z-direction feed screw 6 which is supported parallel to the guide rod 5 on the first horizontal moving table 4 so that the screw 6 is free to rotate. This Z-direction feed screw 6 is driven via a belt means 8 by a Z-direction motor 7 which is fixed on the first horizontal moving table 4. The first horizontal moving table 4 is also slidably installed on a guide rod 10 which is provided in the horizontal Y direction on a second horizontal moving table 9. The first horizontal moving table 4 is engaged with a Y-direction feed screw 11 which is supported parallel to the guide rod 10 on the second horizontal moving table 9 so that the screw 11 is free to rotate. This Y-direction feed screw 11 is driven by a Y-direction driving motor 12 which is fixed on the second horizontal moving table 2. The second horizontal moving table 9 is installed slidably in the horizontal X direction on a base 13 and is driven via an X-direction feed screw (not shown) by an X-direction driving motor 14 which is mounted on the base 13.

When the Z-direction driving motor 7 is driven, the Z-direction feed screw 6 is caused to rotate via the belt means 8. As a result, the plate holder 2 is caused to move in the direction along with the plate holder attachment 3. When the Y-direction driving motor 12 is driven, the first horizontal moving table 4 is caused to move in the Y direction by the Y-direction feed screw 11. Thus, the plate holder 2 is also caused to move in the Y direction. Similarly, when the X-direction driving motor 14 is driven, the second horizontal moving table 9 is caused to move in the X direction, so that the plate holder 2 is also caused to move in the X direction.

Figure 2:
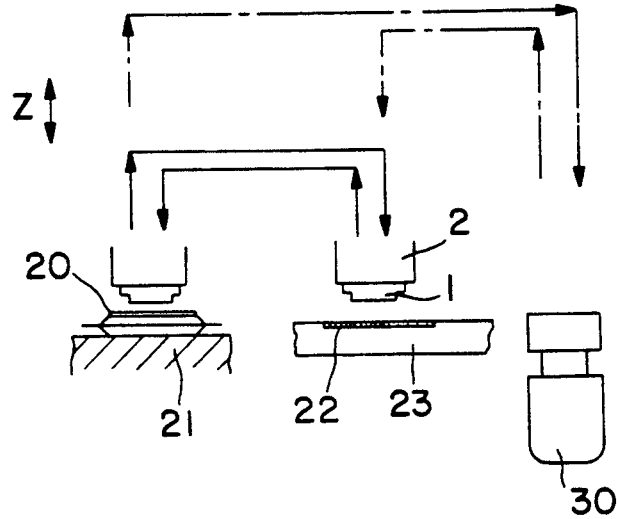
FIG. 2 is an explanatory diagram which illustrates printing operation and printing plate monitoring operation.

As shown in FIG. 2, an ink stand 23 which contains ink 22 is provided away from the workpiece carrying table 21 in the X direction. The workpiece carrying table 21 is for positioning and carrying the workpiece 20 that is to be printed.

A camera 30 is installed at a position away from the workpiece carrying table 21. The camera is set so that the photographing side of the camera 30 faces upward. The image signals from the camera 30 are processed by an image processor 31 shown in FIG. 1 and displayed on a monitor 32.

The Z-direction driving motor 7, Y-direction driving motor 12 and X-direction driving motor 14 are driven via a motor driver 41 by command signals which are preprogrammed in a computer 40. The image processor 31 also processes images from the camera 30 in accordance with commands from the computer 40, and the images are then displayed on the monitor 32. Specifically, a program which controls the printing operation (indicated by the solid arrows in FIG. 2) and a program which controls the printing plate monitoring operation (indicated by the one-dot chain arrows in FIG. 2) are stored beforehand in the computer 40.

Accordingly, the printing operation is accomplished by repeating the actions indicated by the solid arrows in FIG. 2 through the motor driver 41 in accordance with the printing operation program stored in the computer 40. More specifically, ink 22 is applied t the printing plate 1 and then the workpiece 20 is printed, which are done by a combination of movements of the plate holder 2 in the Z direction driven by the Z-direction driving motor 7 and movements of the plate holder 2 on a horizontal plane driven by the X-direction and Y direction driving motors 14 and 12, respectively.

The monitoring operation of the printing plate is performed either periodically or as desired by the operator when the work lot is changed or when the condition of printing is poor. Specifically, this operation is performed as indicated by one-dot chain arrows in FIG. 2 in accordance with the printing plate monitoring operation program of the computer 40 through the motor driver 41. In other words, an action which positions the printing plate 1 above the camera 30 is performed by a combination of movements of the plate holder 2 in the Z direction driven by the Z-direction driving motor 7 and movements of the plate holder 2 in the horizontal plane driven by the X-direction driving motor 14 and the Y-direction driving motor 12. A command is outputted to the image processor 31 by the computer 40, so that the image of the printing plate 1 obtained by the camera 30 is processed by the image processor 31 and displayed on the monitor 32. This printing plate monitoring operation can also be performed without using commands from the computer 40. An operator can manually operate prior art electrical chessman so that the Y-direction driving motor 12 and X-direction driving motor 14 are both driven so as to position the plate holder 2 directly above the camera 30, and then the Z-direction driving motor 7 is driven so that standard lines on the plate holder 2 are matched with the focal point of the camera 30.

If deleterious dirt or ink adhesion to the printing plate 1 is observed when the image of the printing plate 1 is displayed on the monitor 32, the printing plate 1 is cleaned without removing the plate holder 2 from the plate holder attachment 3. If the printing plate 1 is deformed or sagging, then the plate holder 2 is removed from the plate holder attachment 3, and the printing plate 1 is replaced with a new one.

When a start button is pressed after any problems with the printing plate 1 are fixed, the printing plate 1 is raised and moved to a point above the ink 22 by way of the return action of the printing plate monitoring operation. Then, printing onto the workpiece 20 is resumed.

As is clear from the above description, according to the present invention, since the condition of the printing plate can be quickly checked without removing the plate holder from the plate holder attachment, the working efficiency can be improved.

What is claimed is:

1. A method for monitoring a condition of a printing plate during a printing process in a marking device for marking semiconductor devices characterized in that a camera is installed with its photographing side facing up at a position away from a workpiece carrying table which positions and carries a workpiece that is to be printed, a printing plate which is attached to a plate holder is moved to a point above said camera, and said printing plate is periodically displayed on a monitor during the printing process and a condition of said printing plate is periodically checked by means of said monitor during the printing process.

2. An apparatus for monitoring a condition of a printing plate during a printing process in a marking device for marking semiconductor devices characterized in that said apparatus comprises a plate holder to which a printing plate is attached, an X-Y-Z driving means which causes said plate holder to move in X, Y and Z directions, a camera which is installed with its photographing side facing up at a position away from a workpiece carrying table which positions and carries a workpiece that is to be printed, an image processor which processes image signals from said camera during the printing process, and a monitor which periodically displays images in accordance with output of said image processor, so that said printing plate is photographed by said camera and periodically displayed on said monitor during the printing process whereby defective printing plates are detected during the printing process by viewing said monitor.

* * * * *